US009525943B2

(12) United States Patent
Donarski et al.

(10) Patent No.: US 9,525,943 B2
(45) Date of Patent: Dec. 20, 2016

(54) MECHANICALLY ACTUATED PANEL ACOUSTIC SYSTEM

(71) Applicant: Apple Inc., Cupertino, CA (US)

(72) Inventors: Matthew A. Donarski, San Francisco, CA (US); Daniel K. Boothe, San Francisco, CA (US); Justin D. Crosby, Cupertino, CA (US); Mitchell R. Lerner, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/551,631

(22) Filed: Nov. 24, 2014

(65) Prior Publication Data

US 2016/0150318 A1 May 26, 2016

(51) Int. Cl.

| | |
|---|---|
| ***H03G 3/00*** | (2006.01) |
| ***H04R 25/00*** | (2006.01) |
| ***H04R 7/04*** | (2006.01) |
| *H04R 1/24* | (2006.01) |
| *H04R 1/28* | (2006.01) |

(52) U.S. Cl.

CPC ................ *H04R 7/045* (2013.01); *H04R 7/04* (2013.01); *H04R 1/24* (2013.01); *H04R 1/2811* (2013.01); *H04R 2440/00* (2013.01)

(58) Field of Classification Search

CPC ........... H04R 7/045; H04R 1/023; H04R 9/06; H04R 1/00

USPC ......................... 381/104, 152, 337, 150, 339

See application file for complete search history.

(56) References Cited

U.S. PATENT DOCUMENTS

| | | |
|---|---|---|
| 4,081,631 A | 3/1978 | Feder |
| 4,658,425 A | 4/1987 | Julstrom |
| 4,751,419 A | 6/1988 | Takahata |
| 5,031,222 A | 7/1991 | Takaya |
| 5,081,683 A | 1/1992 | Torgeson |

(Continued)

FOREIGN PATENT DOCUMENTS

| | | |
|---|---|---|
| DE | 43 43 807 A1 | 6/1995 |
| EP | 2094032 | 8/2009 |

(Continued)

OTHER PUBLICATIONS

Non-Final Office Action (dated Oct. 22, 2012), U.S. Appl. No. 12/895,526, filed Sep. 30, 2010, First Named Inventor: Aleksandar Pance, 27 pages.

(Continued)

*Primary Examiner* — Thjuan K Addy

(74) *Attorney, Agent, or Firm* — Blakely, Sokoloff, Taylor & Zafman LLP

(57) ABSTRACT

An electronic device includes an enclosure or housing panel that is used as part of an acoustic system. The panel is divided into several sub-panels. For each sub-panel, the device includes one or more actuators attached to vibrate the sub-panel. The actuator and its attached sub-panel convert an audio signal to acoustic output. Each actuator and sub-panel combination may receive a separate audio signal. The device includes a digital signal processor for controlling each of the sub-panel driving audio signals. The device may further include one or more backing frames that are attached to the panel to provide boundary conditions to the sub-panels. The boundary conditions define a resonance frequency for each sub-panel.

20 Claims, 10 Drawing Sheets

(56) References Cited

U.S. PATENT DOCUMENTS

| | | | | |
|---|---|---|---|---|
| 5,335,011 | A | 8/1994 | Addeo et al. | |
| 5,570,324 | A | 10/1996 | Geil | |
| 5,619,583 | A | 4/1997 | Page et al. | |
| 5,649,020 | A | 7/1997 | McClurg et al. | |
| 6,073,033 | A | 6/2000 | Campo | |
| 6,129,582 | A | 10/2000 | Wilhite et al. | |
| 6,137,890 | A | 10/2000 | Markow | |
| 6,151,401 | A | 11/2000 | Annaratone | |
| 6,154,551 | A | 11/2000 | Frenkel | |
| 6,192,253 | B1 | 2/2001 | Charlier et al. | |
| 6,278,787 | B1 | 8/2001 | Azima | |
| 6,278,790 | B1 | 8/2001 | Davis | |
| 6,317,237 | B1 | 11/2001 | Nakao et al. | |
| 6,324,294 | B1 | 11/2001 | Azima et al. | |
| 6,332,029 | B1 | 12/2001 | Azima et al. | |
| 6,342,831 | B1 | 1/2002 | Azima | |
| 6,618,487 | B1 | 9/2003 | Azima et al. | |
| 6,813,218 | B1 | 11/2004 | Antonelli et al. | |
| 6,829,018 | B2 | 12/2004 | Lin et al. | |
| 6,882,335 | B2 | 4/2005 | Saarinen | |
| 6,934,394 | B1 | 8/2005 | Anderson | |
| 7,003,099 | B1 | 2/2006 | Zhang et al. | |
| 7,082,322 | B2 | 7/2006 | Harano | |
| 7,154,526 | B2 | 12/2006 | Foote et al. | |
| 7,158,647 | B2 | 1/2007 | Azima et al. | |
| 7,263,373 | B2 | 8/2007 | Mattisson | |
| 7,266,189 | B1 | 9/2007 | Day | |
| 7,378,963 | B1 | 5/2008 | Begault et al. | |
| 7,536,029 | B2 | 5/2009 | Choi et al. | |
| 7,755,564 | B2 * | 7/2010 | Gonzalez | H01Q 1/084 343/912 |
| 7,804,464 | B2 * | 9/2010 | Gonzalez | H01Q 15/142 343/878 |
| 8,910,748 | B2 * | 12/2014 | Nielsen | E04B 1/90 181/284 |
| 2001/0017924 | A1 | 8/2001 | Azima et al. | |
| 2001/0026625 | A1 | 10/2001 | Azima et al. | |
| 2002/0012442 | A1 | 1/2002 | Azima et al. | |
| 2002/0037089 | A1 | 3/2002 | Usuki et al. | |
| 2002/0044668 | A1 | 4/2002 | Azima | |
| 2002/0150219 | A1 | 10/2002 | Jorgenson et al. | |
| 2003/0048911 | A1 | 3/2003 | Furst et al. | |
| 2003/0053643 | A1 | 3/2003 | Bank et al. | |
| 2003/0161493 | A1 | 8/2003 | Hosler | |
| 2004/0052386 | A1 * | 3/2004 | Heron | H04R 7/045 381/152 |
| 2004/0156527 | A1 | 8/2004 | Stiles et al. | |
| 2004/0203520 | A1 | 10/2004 | Schirtzinger et al. | |
| 2005/0129267 | A1 | 6/2005 | Azima et al. | |
| 2005/0147273 | A1 | 7/2005 | Azima et al. | |
| 2005/0271216 | A1 | 12/2005 | Lashkari | |
| 2006/0005156 | A1 | 1/2006 | Korpipaa et al. | |
| 2006/0023898 | A1 | 2/2006 | Katz | |
| 2006/0072248 | A1 | 4/2006 | Watanabe et al. | |
| 2008/0204379 | A1 | 8/2008 | Perez-Noguera | |
| 2008/0292112 | A1 | 11/2008 | Valenzuela et al. | |
| 2009/0247237 | A1 | 10/2009 | Mittleman et al. | |
| 2009/0274315 | A1 | 11/2009 | Carnes et al. | |
| 2009/0316943 | A1 | 12/2009 | Munoz et al. | |
| 2010/0103776 | A1 | 4/2010 | Chan | |
| 2011/0002487 | A1 | 1/2011 | Panther et al. | |
| 2011/0033064 | A1 | 2/2011 | Johnson et al. | |
| 2011/0161074 | A1 | 6/2011 | Pance et al. | |
| 2011/0243369 | A1 | 10/2011 | Wang | |
| 2011/0274303 | A1 | 11/2011 | Filson et al. | |
| 2012/0082317 | A1 | 4/2012 | Pance et al. | |
| 2012/0250928 | A1 | 10/2012 | Pance et al. | |
| 2012/0263019 | A1 | 10/2012 | Armstong-Muntner | |
| 2012/0306823 | A1 | 12/2012 | Pance et al. | |
| 2013/0028443 | A1 | 1/2013 | Pance et al. | |
| 2013/0051601 | A1 | 2/2013 | Hill et al. | |
| 2013/0129122 | A1 | 5/2013 | Johnson et al. | |
| 2013/0142355 | A1 | 6/2013 | Isaac et al. | |
| 2013/0142356 | A1 | 6/2013 | Isaac et al. | |

FOREIGN PATENT DOCUMENTS

| | | | |
|---|---|---|---|
| GB | 2310559 | | 8/1997 |
| GB | 2342802 | | 4/2000 |
| JP | 2102905 | | 4/1990 |
| JP | 2000134697 | A | 5/2000 |
| JP | 2011228794 | A | 11/2011 |
| WO | 98/53638 | A2 | 11/1998 |
| WO | 02/063919 | A2 | 8/2002 |
| WO | WO-03049494 | | 6/2003 |
| WO | WO-2004025938 | | 3/2004 |
| WO | WO-2007045908 | | 4/2007 |
| WO | WO-2007083894 | | 7/2007 |
| WO | WO-2008153639 | | 12/2008 |
| WO | WO-2009017280 | | 2/2009 |
| WO | WO-2011057346 | | 5/2011 |

OTHER PUBLICATIONS

International Search Report and Written Opinion, PCT/US2011/052589, (Feb. 25, 2012), 13 pages.

Final Office Action (dated Jan. 17, 2013), U.S. Appl. No. 12/895,526, filed Sep. 30, 2010, First Named Inventor: Aleksandar Pance, 20 pages.

PCT International Preliminary Report on Patentability (dated Apr. 11, 2013), International Application No. PCT/US2011/052589, International Filing Date—Sep. 21, 2011, 9 pages.

Non-Final Office Action (dated Mar. 25, 2013), U.S. Appl. No. 13/076,819, filed Mar. 31, 2011, First Named Inventor: Aleksandar Pance, 13 pages.

Final Office Action (dated Aug. 2, 2013), U.S. Appl. No. 13/076,819, filed Mar. 31, 2011, First Named Inventor: Aleksandar Pance, 11 pages.

Non-Final Office Action (dated Dec. 30, 2013), U.S. Appl. No. 13/076,819, filed Mar. 31, 2011, First Named Inventor: Aleksandar Pance, 12 pages.

"Snap fit theory", Feb. 23, 2005, DSM, p. 2, 1 page.

Baechtle, et al., "Adjustable Audio Indicator", IBM, (Jul. 1, 1984), 2 pages.

Hill, et al., "U.S. Appl. No. 13/232,222, filed Sep. 14, 2011 Inventor Hill et al., pending", Published as US 2013-0051601 A1.

Isaac, et al., "U.S. Appl. No. 13/312,498 Inventor Isaac et al., pending", Published as US 2013/0142355 Al.

Isaac, et al., "U.S. Appl. No. 13/343,430 inventor Isaac et al., pending", Published as US 2013/0142356.

Johnson, et al., "U.S. Appl. No. 13/302,673 Inventor Johnson et al., pending", Published as US 2013/0129122 Al.

Pance, et al., "U.S. Appl. No. 13/193,461, filed Jul. 28, 2011 for Inventor Pance et al., pending", Published as US 2013/0028443 A1.

Pingali, et al., "Audio-Visual Tracking for Natural Interactivity", Bell Laboratories, Lucent Technologies, (Oct. 1999), pp. 373-382.

International Application No. PCT/US2015/058155 filed Oct. 29, 2015, PCT International Search Report mailed Jan. 12, 2016.

International Application No. PCT/US2015/058155 filed Oct. 29, 2015 PCT Written Opinion of the International Search Authority mailed Jan. 12, 2016.

* cited by examiner

MECHANICALLY ACTUATED PANEL ACOUSTIC SYSTEM

FIELD

An embodiment of the invention relates to an electronically controlled sound production system for use in a consumer electronics device, such as a desktop computer. Other embodiments are also described.

BACKGROUND

Many consumer electronics devices, such as desktop computers, laptop computers, and smart phones are becoming more compact. As these devices become smaller, the internal space available within their enclosure or housing for built-in loudspeakers becomes smaller as well. This is especially true as space within the device enclosure for speakers may compete with many other components such as circuit boards, mass storage devices, and displays. Generally, as a speaker decreases in size it is able to move less air mass and thus sound quality (or at least loudness) may decrease. This may be especially noticeable for sounds in the lower end of the audio spectrum, e.g. beneath 1 kHz. Furthermore, as the available open air volume within an electronic device shrinks, there is less air for a speaker to vibrate and thus limits the audible response. Similarly, the volume level and frequencies able to be produced by a speaker may also decrease as the size of the speaker decreases. Thus, as electronic devices continue to decrease in size, detrimental effects may be experienced for audio produced by the devices. Producing low frequency audio content (bass) out of thin consumer electronics devices is one of the most important problems in modern audio engineering.

SUMMARY

The large surface area of the enclosure or housing of a consumer electronics device can be exploited to facilitate a mechanically actuated panel acoustic system. An embodiment of the present disclosure is an electronic device whose enclosure or housing panel is used as part of an acoustic system (electronically controlled sound producing system). The panel is divided into several sub-panels. For each sub-panel, the device includes one or more sub-panel actuators attached to vibrate the sub-panel. The actuator and its attached sub-panel convert an audio signal to acoustic output. Each actuator and sub-panel combination may receive a separate audio signal. The device includes a digital signal processor for controlling each of the sub-panel driving audio signals. The device may further include one or more backing frames that are attached to the panel (e.g., the interior surface of the panel) to provide boundary conditions to the sub-panels. The boundary conditions define a resonance frequency for each sub-panel.

In one embodiment, different sub-panels are designed to have different resonance frequencies. For each sub-panel, the audio signal driving the actuator of the sub-panel may be limited to a narrow frequency band at the resonance frequency of the sub-panel. The sum of the acoustic outputs of the sub-panels produces low frequency sound over a wide frequency band. In one embodiment, the resonance frequencies of the sub-panels correspond to notes on the musical scale. For each sub-panel, the digital signal processor processes or controls the audio signal that is driving the sub-panel so that the acoustic outputs of the sub-panels are coherent and can therefore be summed or combined constructively.

In one embodiment, each sub-panel has a sealed back volume (of air). In another embodiment, the backing frames have air passages that connect the back air volumes of two or more of the sub-panels, so that those sub-panels share a common back air volume. In one embodiment, such sub-panel division is left-right symmetric, and the sub-panels (when excited by their audio signals) can produce stereo audio. In another embodiment, sub-panel division is non-symmetric and two or more of the sub-panels may be excited to produce mono-audio.

Another embodiment of the present disclosure is a method for producing an audible sound on a device. Several sub-band audio signals are generated by filtering a received audio signal. The method then processes the sub-band audio signals separately so that the sub-band audio signals can be converted into acoustic outputs that are coherent and can therefore be summed or combined constructively. Several sub-panels, which are part of a panel on the device, are then driven with the processed sub-band audio signals, respectively. The panel may be part of an outer enclosure of the device.

In one embodiment, a sub-band audio signal has a narrow frequency band that surrounds a resonance frequency of a sub-panel that is driven by the sub-band audio signal. In order to process the sub-band audio signal, the method determines, for each frequency component of the sub-band audio signal, whether amplitude of the sub-band audio signal at that frequency exceeds a threshold. If so, the sub-band audio signal at that frequency is aligned to the resonance frequency of the sub-panel. In one embodiment, the resonance frequency of the sub-panel corresponds to a note on the musical scale.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In this section we shall explain several preferred embodiments of this disclosure with reference to the appended drawings. Whenever the shapes, relative positions and other aspects of the parts described in the embodiments are not clearly defined, the scope of the disclosure is not limited only to the parts shown, which are meant merely for the purpose of illustration. Also, while numerous details are set forth, it is understood that some embodiments of the disclosure may be practiced without these details. In other instances, well-known structures and techniques have not been shown in detail so as not to obscure the understanding of this description.

One of ordinary skill in the art will realize that the terms "front", "forward", "back/rear", or "rearward" are used only to make it easier to understand, not to limit, the scope of the invention. In one embodiment, a front panel or back panel described in this disclosure can be any panel on a device.

Figure 1:
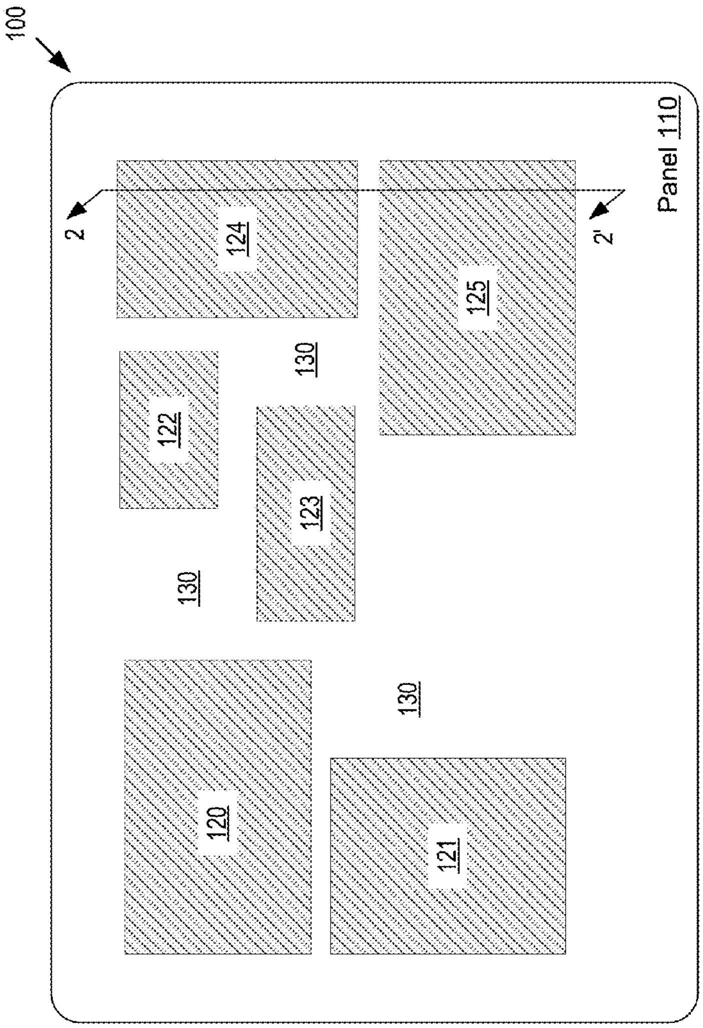
FIG. 1 illustrates an example of an audio device of one embodiment having a panel divided into several sub-panels to form a mechanically actuated panel acoustic system.

FIG. 1 illustrates an example of an audio device in accordance with one embodiment of the invention having a panel divided into several sub-panels to form a mechanically actuated panel acoustic system. As shown in the figure, the audio device 100 is an apparatus having a panel (e.g., back panel) 110, which is divided into several sub-panels 120-125. Each of the sub-panels 120-125 acts as a diaphragm of a transducer (loudspeaker). It is mechanically actuated to produce an acoustic output. Each sub-panel is individually actuated or driven by an individually digitally signal processed audio signal (so-called sub-panel audio signal).

The audio device 100 is capable of storing and/or processing signals such as those used to produce sound. The audio device 100 may be a laptop computer, a handheld electronic device, a mobile telephone, a tablet computer, a display device, an audio playback device, such as an MP3 player, or other electronic audio device. The panel 110 may be a back panel of the audio device 100, or another panel that is part of the outer enclosure of the audio device 100. The panel 110 can be made of glass, aluminum, or any suitable material, as long as it is reasonably stiff and reasonably flat, yet sufficiently flexible to vibrate for producing sound.

In one embodiment, the panel 110 is a uniform panel (e.g., having uniform thickness). The sub-panels 120-125 are divided by, and may be defined by, one or more backing frames 130 so that only the areas of the panel 110 that are within the boundaries formed by the backing frames 130 can be bent or vibrated. The backing frames 130 produce the proper boundary conditions for the sub-panels 120-125 to obtain the desired resonance frequency for each of the sub-panels. The backing frames 130 may be formed of an integral piece or separate pieces. The backing frames 130 may be formed of sufficiently heavy and sufficiently stiff plate that has openings formed therein that define the vibration areas of the sub-panels. In one embodiment, the backing frames 130 can be the front or rear outside wall of the audio device 100. In one embodiment, the outside wall can be touched by the user.

The audio device 100 was described above for one embodiment of the disclosure. One of ordinary skill in the art will realize that in other embodiments, this device can be implemented differently. For instance, instead of dividing the panel 110 into six sub-panels, the panel 110 can be divided into two sub-panels, three sub-panels, or more than three sub-panels. In one embodiment, the number of sub-panels depends on the stiffness of the panel 110 and the size of the panel. In one embodiment, the number of sub-panels also depends on the capabilities of additional loudspeakers (not shown) that operate together with the panel acoustic system to produce sound (e.g., as part of a multi-channel audio system).

Figure 2A:
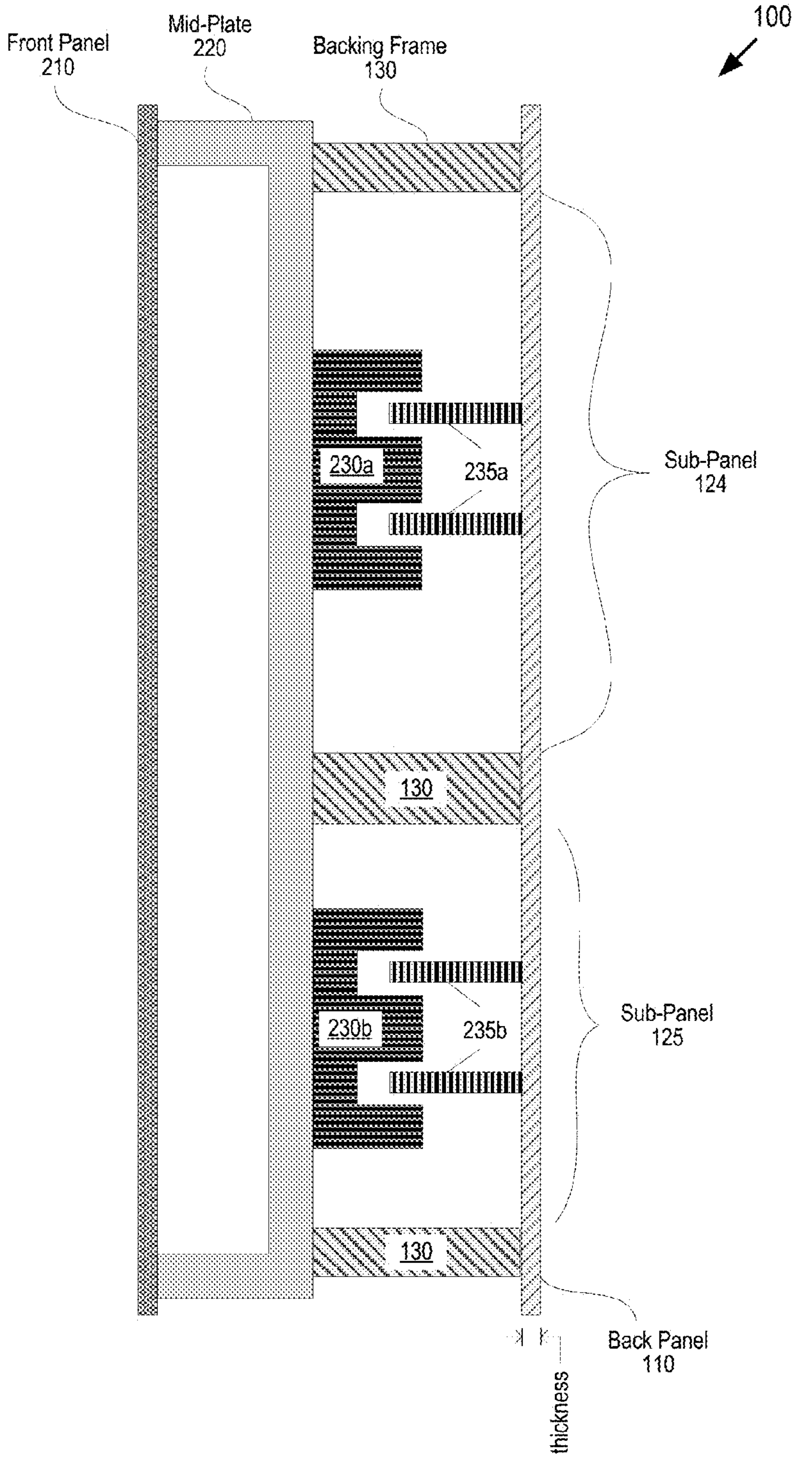
FIG. 2A illustrates a cross-sectional side view of part of the audio device of FIG. 1.

FIG. 2A illustrates a cross-sectional side view (along line 2-2') of part of the audio device 100 of FIG. 1. Specifically, this figure shows a mechanically actuated panel acoustic system that uses sub-panels 124 and 125 as loudspeaker diaphragms. As illustrated in FIG. 2A, the audio device 100 includes a front panel 210, a back panel 110, a mid-plate 220, backing frames 130, magnets **230*a* and 230*b*, and voice coils 235*a* and 235*b***.

The backing frames 130 are supported by the mid-plate 220, which is sufficiently heavy and sufficiently rigid to prevent the portions of the back panel 110 that are in contact with the backing frames 130 from vibrating. The mid-plate 220 may thus have one side that is in contact with the front panel 210 and an opposite side that is in contact with the backing frames 130. The mid-plate 220 cannot be touched by the user. The backing frames 130 wall off each sub-panel (e.g., 124 and 125) to create boundary conditions for each of the sub-panels. The boundary conditions created by the backing frames 130 may define the targeted resonance frequencies for the sub-panels. Even though all the backing frames are labeled with the same number 130 in FIG. 2A, a person of ordinary skill in the art would recognize that the backing frames can be formed of separate pieces or a single integral piece.

The back panel 110 can be made of glass, aluminum, or any suitable material, as long as it is reasonably stiff and reasonably flat. As illustrated in FIG. 2A, the back panel 110 has uniform thickness. However, in another embodiment, the back panel 110 can have non-uniform thickness, as will be described in FIG. 4 below. The back panel 110 is divided, by the backing frames 130, into several sub-panels, e.g. 124 and 125. Each sub-panel is individually actuated to vibrate. For example, the sub-panel 124 is actuated by interactions between the magnet **230*a* and the voice coil 235*a*, and the sub-panel 125 is actuated by interactions between the magnet 230*b* and the voice coil 235*b*. The magnets 230*a* and 230*b* are attached to the mid-plate 220, while the voice coils 235*a* and 235*b* are attached to the back panel 110**. There is at least one actuator, i.e. magnet and voice coil pair, for each sub-panel.

One of ordinary skill in the art will recognize that the audio device 100 described in FIG. 2A is a conceptual representation of a mechanically actuated panel acoustic system. The specific constructions and arrangements of the acoustic system may not be limited to the exact way shown and described. For example, some or all of the backing frames 130 can be supported directly by the front panel 210 (e.g., by extending portions of the front panel 210 rearward, or by further extending the backing frames 130 forward), without the need for mid-plate 220. In that case, the magnet 230 could be secured to another structure that is part of, or attached to, the front panel 210. The magnet 230 of an actuator can be attached to the back panel 110 while the voice coil 235 of the actuator can be attached to the mid-plate. Instead of using sub-panels of the back panel 110 as the diaphragms of the acoustic system, sub-panels of the front panel 210 can be used as the diaphragms of the acoustic system.

Figure 2B:
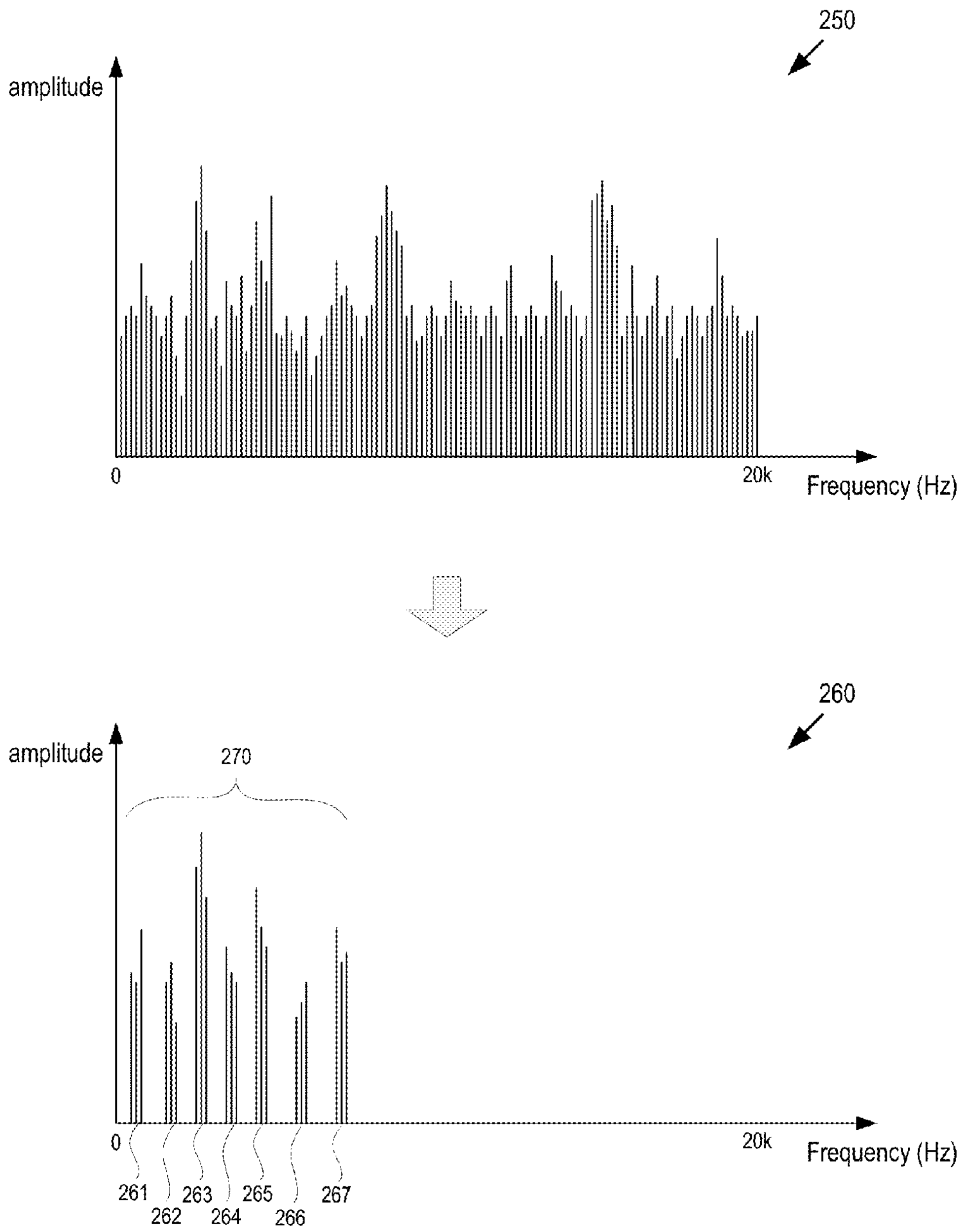
FIG. 2B illustrates an example of the narrow band audio signals that drive the sub-panels of the audio device of FIGS. 1 and 2A.

FIG. 2B illustrates an example of the narrow band audio signals that drive the sub-panels of the audio device of FIGS. 1 and 2A. As illustrated in FIG. 2B, chart 250 shows the original audio signal in the frequency domain, and chart 260 show the narrow band sub-panel audio signals 261-267 after the original audio signal is filtered. Each of the narrow band sub-panel audio signal 261-267 drives a respectively sub-panel of the device. The summation of the acoustic outputs of all the sub-panels produces low frequency sound over a wide frequency band 270. The wide frequency band 270 covers a frequency range that is larger than the frequency range of any of the narrow band sub-panel audio signals 261-267. In one embodiment, the wide frequency band 270 covers a frequency range that is larger than the combination of the frequency ranges of the narrow band sub-panel audio signals 261-267.

Figure 3:
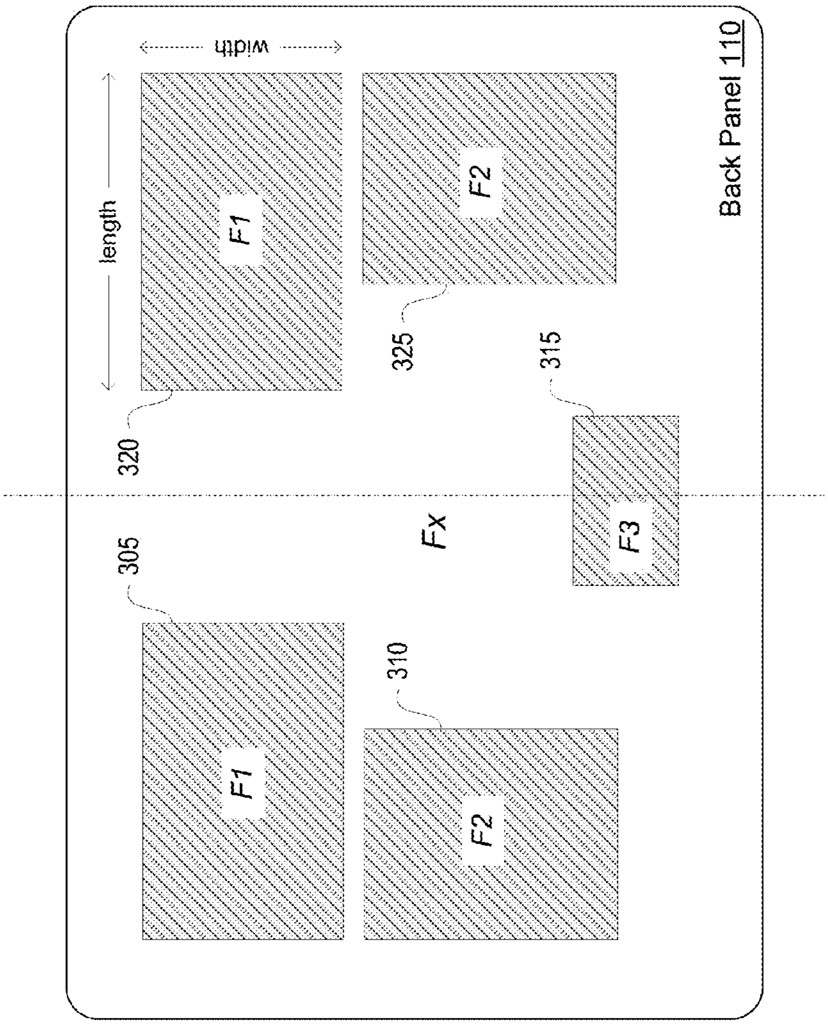
FIG. 3 illustrates another example of using a panel on an audio device to form a mechanically actuated panel acoustic system.

FIG. 3 illustrates another example of using a panel on an audio device to form a mechanically actuated panel acoustic system. As illustrated in this figure, the back panel 110 is divided into several sub-panels 305-320. The back panel 110 itself has a resonance frequency $F_x$. The sub-panels 305 and 320 have resonance frequency $F_1$. The sub-panels 310 and 325 have resonance frequency $F_2$. The sub-panel 315 has resonance frequency $F_3$. In one embodiment, $F_1$, $F_2$ and $F_3$ can all be different, and each of $F_1$, $F_2$ and $F_3$ is greater than $F_x$. For example, $F_1$ can be a factor of 10 greater than $F_x$. In one embodiment, sub-panels operating in close frequency ranges are kept far apart on the panel.

In one embodiment, the actuator of each sub-panel is driven by a "narrow band" audio signal whose spectral content is at or around the resonance frequency of the sub-panel. By having different resonance frequencies for different sub-panels, one embodiment of the audio device is able to combine the acoustic outputs of the sub-panels to produce low frequency sound over a "wide band". In one embodiment, the acoustic outputs of the sub-panels are combined with the acoustic output of other speakers (not shown) that produce sound at frequencies above the resonance frequencies of the sub-panels.

As illustrated in FIG. 3, sub-panels 305 and 310 are left-right symmetric with sub-panels 320 and 325 (e.g., 305 and 320 may be replicates, while 310 and 325 may be replicates, and are symmetrically positioned relative to the center line shown). The sub-panels 305, 310, 320, and 325 may be excited to produce stereo audio. For example, the sub-panels 305 and 310 produce one channel and the sub-panels 320 and 325 produce another channel. In another embodiment and as illustrated in FIG. 1, sub-panel division is non-symmetric and the sub-panels may be excited to produce mono-audio.

The resonance frequency of a sub-panel is also determined by the length and width of the sub-panel, flexural rigidity (e.g., thickness and density) of the sub-panel, and boundary conditions of the sub-panel. In one embodiment, vibration mode 1:1 (the fundamental resonant mode) is the preferred mode for all sub-panels. In one embodiment, a sub-panel with vibration mode 2:1 is positioned as far away from a sub-panel with vibration mode 1:1 as far as possible.

Figure 4:
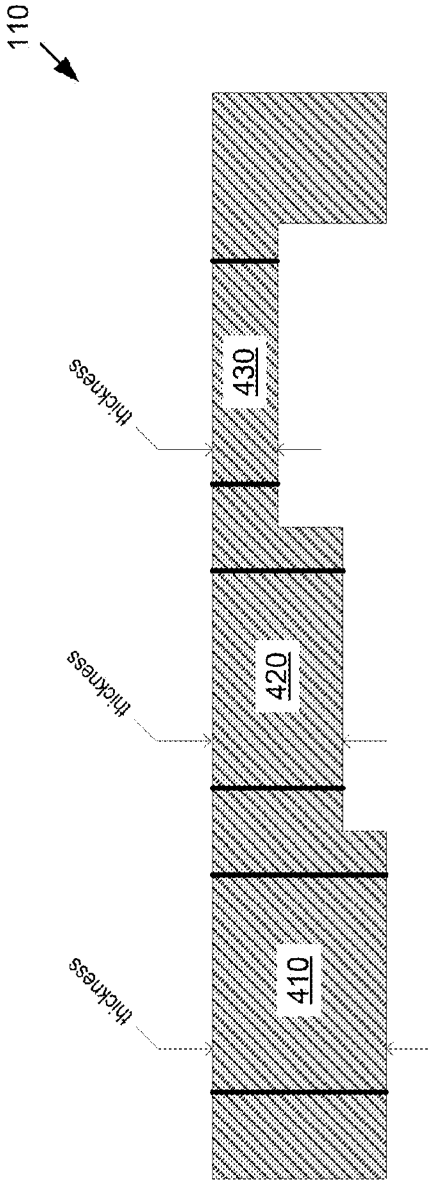
FIG. 4 illustrates a cross-sectional side view of part of a mechanically actuated panel acoustic system that has non-uniform thickness.

In one embodiment, the panel 110 has uniform thickness, such that all sub-panels have the same thickness. In another embodiment, the panel 110 can have non-uniform thickness so that different sub-panels can have different thickness. FIG. 4 illustrates a cross-sectional side view of one example of part of a mechanically actuated panel acoustic system having non-uniform thickness. As illustrated, the panel 110 has three sub-panels 410, 420, and 430, each of which has different thickness. Therefore, even if sub-panels 410, 420, and 430 have the same length and width, their resonance frequencies can be different because of their different thickness.

Figure 5:
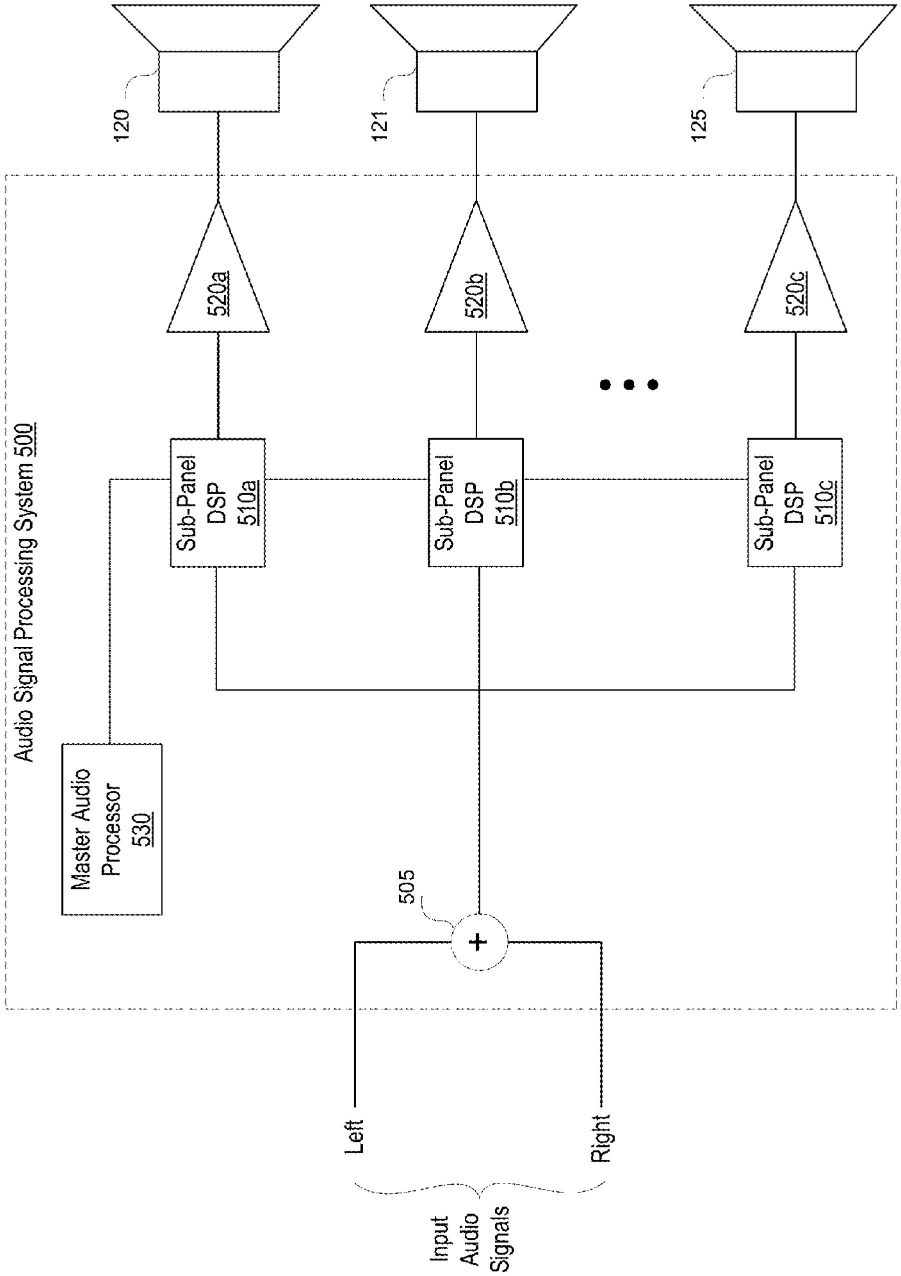
FIG. 5 illustrates a block diagram of an audio signal processing system that uses multiple digital signal processors to separately process the sub-panel audio signals of a mechanically actuated panel acoustic system.

In one embodiment, the actuator of each sub-panel is driven by an individually digitally signal processed audio signal. FIG. 5 illustrates a block diagram of an audio signal processing system 500 of one embodiment that uses multiple digital signal processors to separately process in parallel the sub-panel audio signals of a mechanically actuated panel acoustic system. In one embodiment, the audio signal processing system 500 may be housed within the same enclosure as the actuators and sub-panels, as part of the audio device 100 described in FIGS. 1 and 2A above. The audio signal processing system 500 processes one or more input audio signals (e.g., a single channel or mono audio, left and right stereo, or 5.1 multi-channel audio) to produce the sub-panel signals that drive the sub-panels of the panel acoustic system described in FIGS. 1-3 above. As illustrated in the figure, the audio signal processing system 500 may include a channel combiner 505, a master audio processor 530, several sub-panel digital signal processors 510_a_-510_c_, and several amplifiers 520_a_-520_c_.

Each sub-panel of the mechanically actuated panel acoustic system is driven by a sub-band audio signal that is individually processed or controlled by a digital signal processor and an amplifier. For example, the audio signal driving sub-panel 120 is processed by the sub-panel digital signal processor 510_a_ and the amplifier 520_a_, the audio signal driving sub-panel 121 is processed by the sub-panel digital signal processor 510_b_ and the amplifier 520_b_, the audio signal driving sub-panel 125 is processed by the sub-panel digital signal processor 510_c_ and the amplifier 520_c_.

In one embodiment, the channel combiner 505 combines input audio signals, e.g., left and right audio channels, and sends a combined audio signal to the sub-panel digital signal processors 510_a_-510_c_. Each of the sub-panel digital signal processors 510_a_-510_c_ filters, e.g., using band pass filters, the received audio signal to derive a sub-band audio signal (which may become the sub-panel signal that drives the actuator of its corresponding sub-panel). In one embodiment, the spectral content of the sub-band audio signal is at or around the resonance frequency of the corresponding sub-panel. In one embodiment, each of the sub-panel digital signal processors 510_a_-510_c_ may also perform equalization, cross-over filtering, delay, or all-pass filtering individually upon its sub-band signal (to derive the sub-panel signal for its corresponding sub-panel). In one embodiment, the sub-panel digital signal processors (e.g., 510_a_-510_c_) control the magnitude and phase of each individual sub-panel audio signal, so that the acoustic summation of all the sub-panels driven by these audio signals is coherent and constructive. That is, all the sub-panels produce acoustic outputs that have constructive interference. In one embodiment, the sub-panel digital signal processors 510_a_-510_c_ communicate with the master audio processor 530 in order to achieve the constructive interference.

In one embodiment, because of the processing by the sub-panel digital signal processors (e.g., 510*a*-510*c*), the sound from each sub-panel reaches the listener at around the same time. These acoustic results may require that one or more of the digital signal processors 510 communicate with each other or with the master audio processor 530 to ensure that the sub-panel signals are produced or controlled appropriately, e.g., to set relative magnitude and phase behaviors amongst them. In one embodiment, such mechanism enables a portion of the digital signal processors to make sure that the majority of sub-panel signal energy that drives a particular sub-panel is centered around the frequency of the 1:1 vibration mode for the sub-panel. In one embodiment, a digital signal processor can be shared by two or more sub-panels. That is, a digital signal processor may process an audio signal to drive two or more sub-panels that have the same resonance frequency.

Figure 6:
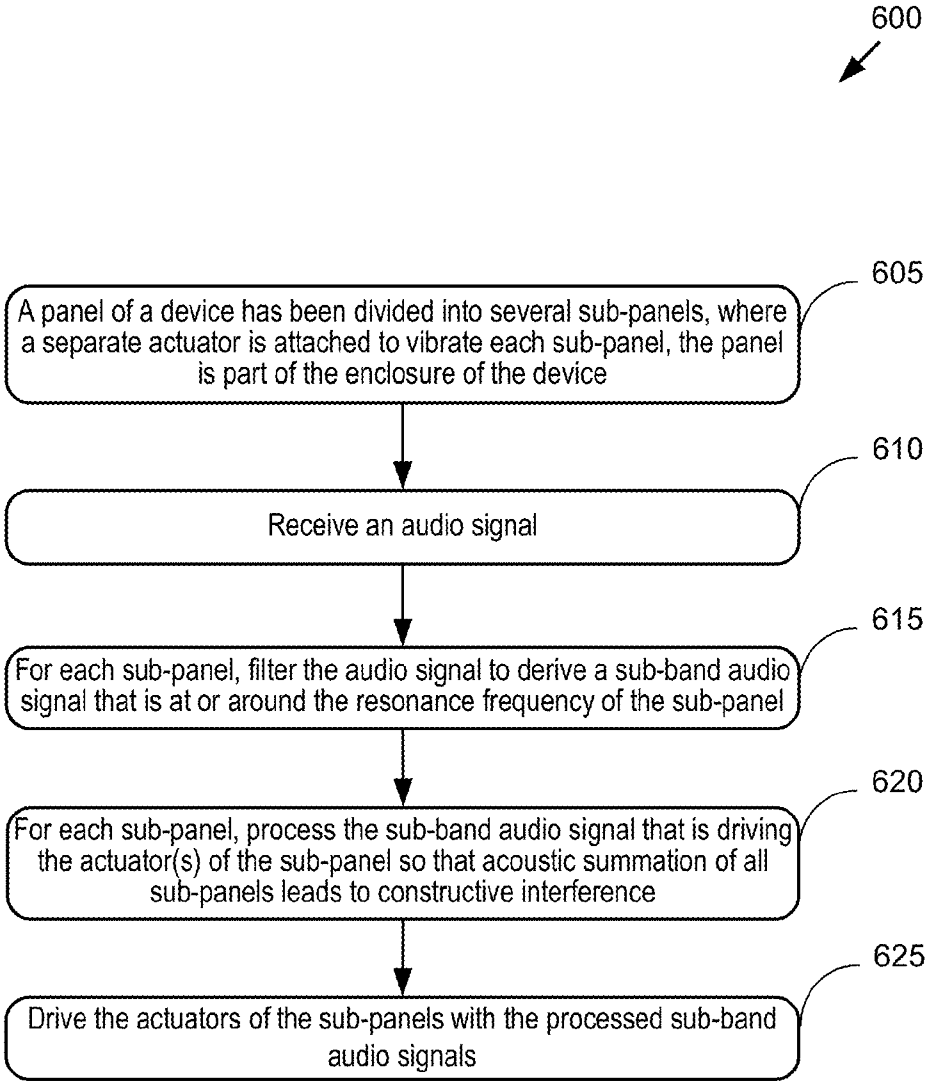
FIG. 6 is a list of process operations performed in a device for using a panel of the device to produce acoustic output.

FIG. 6 is a list of process operations performed in a device for using a panel of the device to produce acoustic output, referred to as process 600. In one embodiment, the process 600 may be performed by the audio device 100 of FIGS. 1 and 2A to convert an input audio signal to sound. As illustrated in FIG. 6, process 600 assumes (at block 605) that a panel of a device has been divided into several sub-panels, where a separate actuator is attached to vibrate each sub-panel and each sub-panel has a targeted resonance frequency and a respective actuator to vibrate it. The panel is part of the outer enclosure of the device.

At block 610, process 600 receives an audio signal (e.g., derived from multi-channel digital audio). For each sub-panel, process 600 filters (at block 615) the audio signal to derive or generate a sub-band audio signal that is at or around the resonance frequency of the sub-panel. For each sub-panel, process 600 processes (at block 620) the sub-band audio signal that is driving one or more actuators of the sub-panel so that acoustic summation of all sub-panels leads to constructive interference. In one embodiment, the operations of blocks 615 and 620 are performed by the audio signal processing system 500 described in FIG. 5 above.

Process 600 drives (at block 625) the actuators of the sub-panels with the processed sub-band audio signals. One of ordinary skill in the art will recognize that process 600 is a conceptual representation of the operations for using a panel of a device to produce acoustic output. The specific operations of process 600 may not be performed in the exact order shown and described. The specific operations may not be performed in one continuous series of operations, and different specific operations may be performed in different embodiments. Furthermore, process 600 could be implemented using several sub-processes, or as part of a larger macro process.

Figure 7:
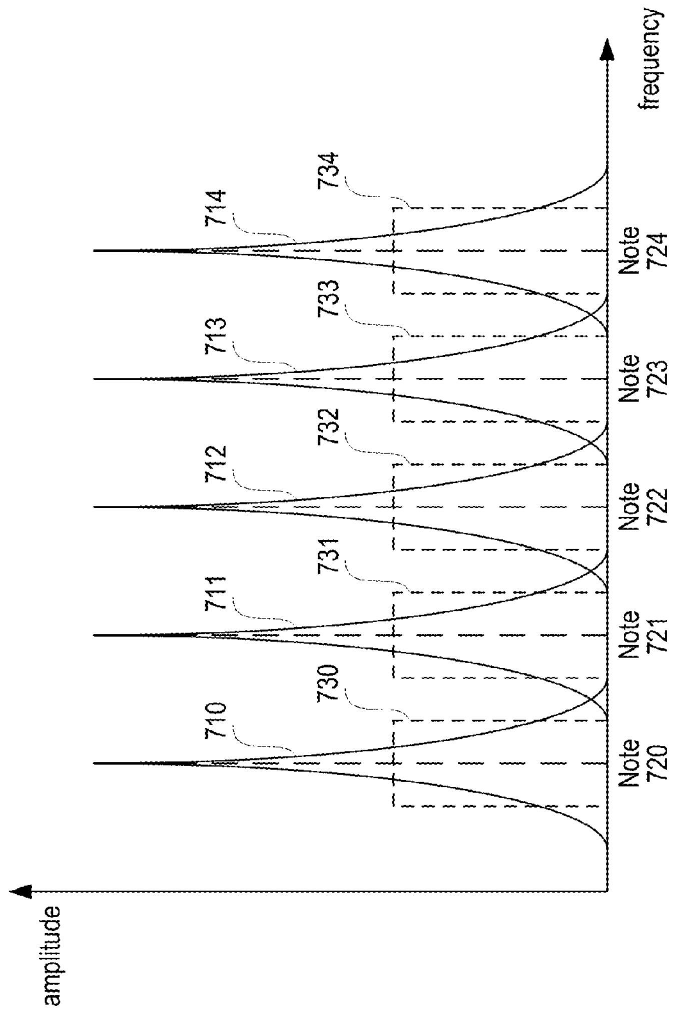
FIG. 7 illustrates an example of aligning sub-panel audio signals with notes on the musical scale.

In one embodiment, the resonance frequencies of the sub-panels can be designed to coincide with notes on the musical scale. FIG. 7 illustrates an example of aligning sub-panel audio signals with notes on the musical scale. As illustrated in this figure, curves 710-714 represent the acoustic output of five different sub-panels, respectively. The resonance frequency of each sub-panel corresponds to a note on the musical scale. For example, the resonance frequency of the sub-panel producing acoustic output curve 710 corresponds to note 720, the resonance frequency of sub-panel producing acoustic output curve 711 corresponds to note 721, and so on. Each of frequency bands 730-734 represents a narrow (high Q) frequency band surrounding a musical note. For example, frequency band 730 represents a narrow frequency band surrounding note 720; frequency band 731 represents a narrow frequency band surrounding note 721, and so on.

In one embodiment, when the input audio signal has spectral content that falls into one of the narrow frequency bands that surround notes on the musical scale, the associated sub-panel audio signal (that is produced to drive the respective sub-panel) is aligned or tuned with (or transformed into) the corresponding musical note. For instance, spectral content anywhere within the frequency band 730 will be played as note 720; audio signal within the frequency band 731 will be played as note 721, and so on. In one example, audio signal at 436 Hz will be played as 440 Hz (note A4) because 436 Hz is within the narrow frequency band surrounding the note A4. By performing this tuning, the audio device sounds more musical and more efficient.

Figure 8:
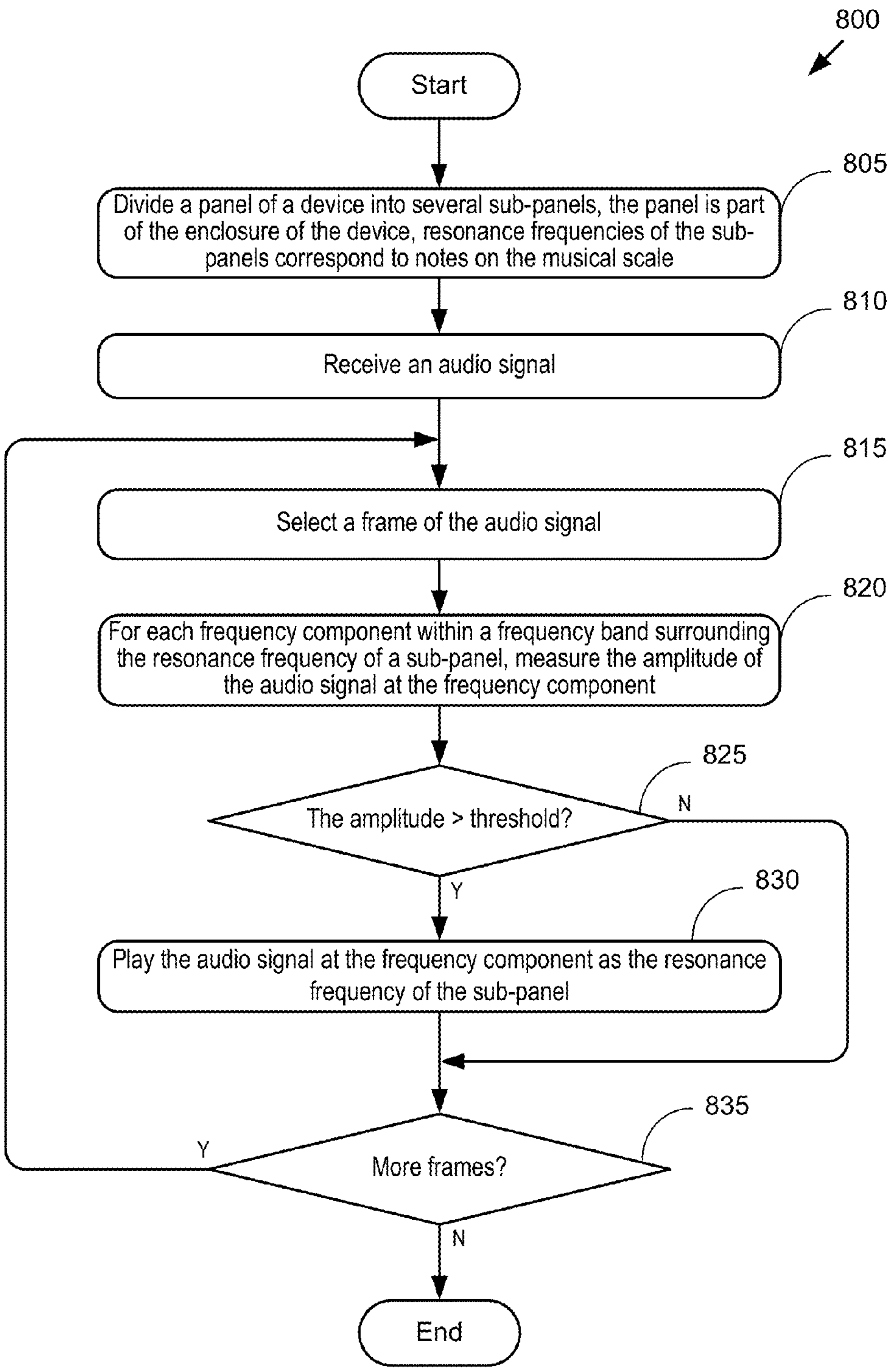
FIG. 8 illustrates a flowchart of operations performed in a device for aligning audio signal to notes on the musical scale.

FIG. 8 illustrates a flowchart of operations performed in a device for aligning audio signal to notes on the musical scale, referred to as process 800. In one embodiment, the audio device 100 of FIGS. 1 and 2A executes process 800 to convert an input audio signal to sound. As illustrated in FIG. 8, process 800 begins by dividing (at block 805) a panel of a device into several sub-panels so that each sub-panel has a targeted resonance frequency. The panel is part of the enclosure of the device. In one embodiment, the resonance frequencies of the sub-panels correspond to notes on the musical scale, as described in relation to FIG. 7 above.

At block 810, process 800 receives an audio signal. Process 800 selects (at block 815) a frame of the audio signal. For each frequency component within a frequency band surrounding the resonance frequency of a sub-panel, process 800 measures (at block 820) the amplitude of the audio signal at the frequency component. Process 800 determines (at block 825) whether the amplitude of the audio signal at the frequency component is greater than a predefined threshold. If the amplitude is not greater than the threshold, process 800 proceeds to block 835. However, if the amplitude of the audio signal at the frequency component is greater than the threshold, process 800 plays (at block 830) the audio signal at the frequency component as the resonance frequency of the sub-panel, as described in relation to FIG. 7 above. In one embodiment, the operations of blocks 820 and 825 are implemented by a band pass filter and an root-mean-square (RMS) level-meter.

At block 835, process 800 determines whether there are more frames of the audio signal for processing. If there are more frames, process 800 loops back to block 815 to select the next frame of the audio signal. If there are no more frames, process 800 ends. In one embodiment, the operations of blocks 815-825 are performed by the audio signal processing system 500 described in FIG. 5 above.

One of ordinary skill in the art will recognize that process 800 is a conceptual representation of the operations for using a panel of a device to produce acoustic output. The specific operations of process 800 may not be performed in the exact order shown and described. The specific operations may not be performed in one continuous series of operations, and different specific operations may be performed in different embodiments. Furthermore, process 800 could be implemented using several sub-processes, or as part of a larger macro process.

In one embodiment, each sub-panel may have its own sealed back air volume. In another embodiment, backing frames may have air passages that connect the back air volume of the sub-panels so that all the sub-panels share a common back air volume. The sealed back air volume behind a sub-panel acts as a spring in determining the resonance frequency of the sub-panel. The resonance frequency of a sub-panel is a function of its own bending stiffness and the stiffness of the volume of air behind it. The relative contribution of the volume of air to the overall resonance of a sub-panel scales with the size of the sub-panel. Big sub-panel pushing against small air volume is actually extremely stiff, even if the sub-panel itself is loose. Therefore, all the sub-panels can experience the loosest possible spring if all the various volumes of air of the sub-panels are connected.

Figure 9:
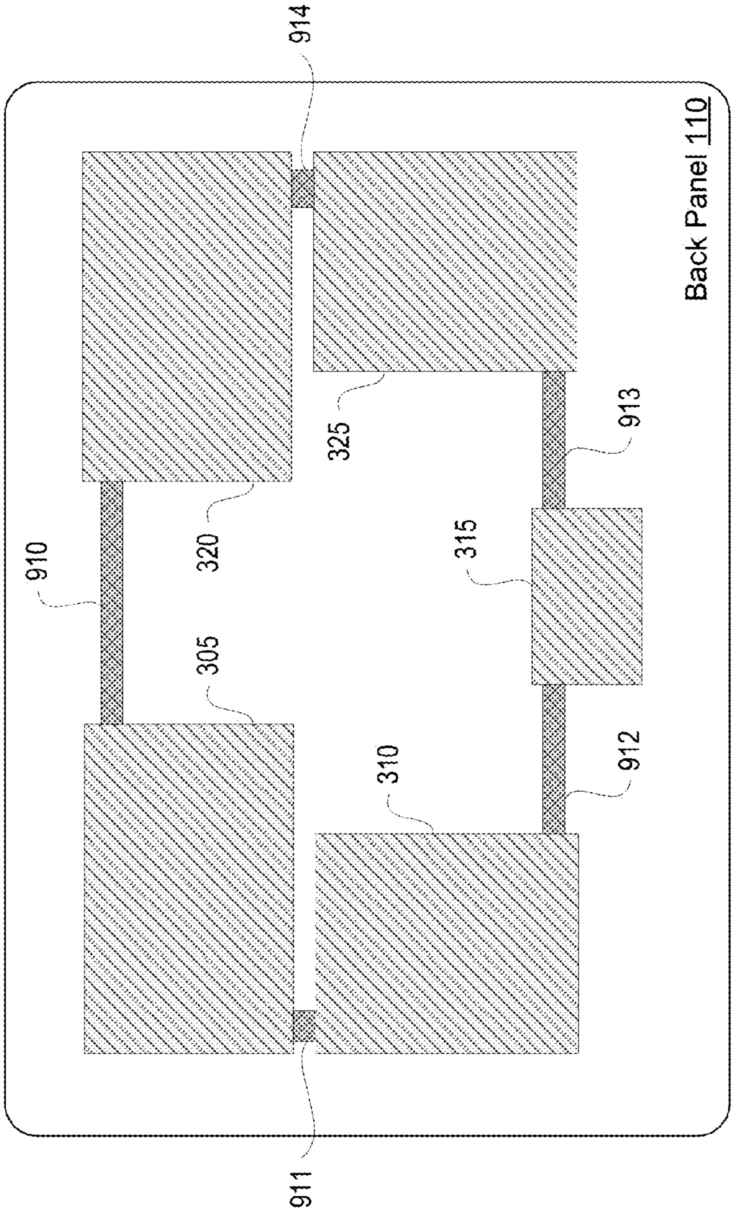
FIG. 9 illustrates an example of an acoustic system of one embodiment in which all sub-panels are sharing a common back air volume.

FIG. 9 illustrates an example of an acoustic system of one embodiment in which all sub-panels are sharing a common back air volume. As illustrated in this figure, there are several air passages 910-915 within the backing frames that connect the back air volumes of the sub-panels 305, 310, 315, 320, and 325 so that all the sub-panels share a common back air volume.

By sharing a common back air volume, the air stiffness for each sub-panel becomes much smaller. This allows low effective resonance frequency for sub-panels. This also allows the bending stiffness of the sub-panel to dominate in the determination of the resonance frequency of the sub-panel. Having the bending stiffness of the sub-panel dominating is beneficial for achieving the targeted resonance frequency.

While certain embodiments have been described and show in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. An electronic audio device comprising:

a panel that is a part of an outer enclosure of the electronic audio device, wherein the panel is divided into a plurality of sub-panels defined by one or more backing frames attached to the panel;

a plurality of sub-panel actuators each being attached to a respective one of the plurality of sub-panels and that is to convert a respective sub-panel audio signal into acoustic output by vibrating the respective sub-panel; and a plurality of digital signal processors each to control the respective sub-panel audio signal that is driving the sub-panel actuator.

2. The electronic audio device of claim 1 wherein the one or more backing frames are attached to the panel to provide boundary conditions to the plurality of sub-panels, wherein the boundary conditions define a resonance frequency for each sub-panel.

3. The electronic audio device of claim 2, wherein the panel has uniform thickness over all of the sub-panels.

4. The electronic audio device of claim 2, wherein spectral content of the respective sub-panel audio signal is at or around the resonance frequency of the sub-panel.

5. The electronic audio device of claim 2, wherein the one or more backing frames have air passages that connect back air volume of the plurality of sub-panels so that the plurality of sub-panels share a back air volume.

6. The electronic audio device of claim 1, wherein sub-panel division is such that no surface area of any of the plurality of sub-panels overlaps another.

7. The electronic audio device of claim 1, wherein sub-panel division is non-symmetric and two or more of the plurality of sub-panels can be excited to produce mono-audio.

8. The electronic audio device of claim 1, wherein each sub-panel has a sealed back volume.

9. A method for producing an audible sound on a device, the method comprising:

receiving an audio signal;

generating a plurality of sub-band audio signals by filtering the audio signal;

processing the plurality of sub-band audio signals separately; and driving a plurality of actuators associated with a plurality of sub-panels of a panel on the device with the plurality of processed sub-band audio signals, wherein the panel is a part of an enclosure of the device, wherein each of the plurality of sub-band audio signals drives one or more actuators associated with a sub-panel of the plurality of sub-panels, wherein spectral content of a sub-band audio signal surrounds a resonance frequency of a sub-panel that is driven by the sub-band audio signal, and wherein the resonance frequency of the sub-panel corresponds to a note on a musical scale.

10. The method of claim 9, wherein the spectral content of the sub-band audio signal is at the resonance frequency of the sub-panel that is driven by the sub-band audio signal.

11. The method of claim 9, wherein the processing of the sub-band audio signal comprises:

for each frequency component within the sub-band audio signal, determining whether amplitude of the sub-band audio signal at the frequency component exceeds a threshold; and aligning the sub-band audio signal at the frequency component to the resonance frequency of the sub-panel when the amplitude of the sub-band audio signal at the frequency component exceeds the threshold.

12. The method of claim 9, wherein each of the plurality of sub-band audio signals is processed individually so that acoustic outputs of the plurality of sub-panels are coherent and can be combined constructively.

13. The method of claim 9, wherein acoustic summation of the plurality of sub-panels produces low frequency sound over a wide band.

14. An apparatus comprising:

a panel that is divided into a plurality of sub-panels defined by one or more backing frames attached to the panel;

for each of the plurality of sub-panels, one or more actuators attached to the sub-panel and that is to convert a respective sub-panel audio signal into acoustic output by vibrating the sub-panel; and for each of the plurality of sub-panels, a digital signal processor that is to control the respective sub-panel audio signal that is driving the one or more actuators attached to the sub-panel.

15. The apparatus of claim 14 wherein the one or more backing frames are attached to the panel to provide boundary conditions to the plurality of sub-panels, wherein the boundary conditions define a resonance frequency for each sub-panel.

16. The apparatus of claim 15, wherein at least two of the sub-panels have different resonance frequencies.

17. The electronic audio device of claim 1, wherein the panel comprises glass or aluminum.

18. The electronic audio device of claim 1, wherein the panel is a part of the outer enclosure of one of the following: a laptop computer, a handheld electronic device, a mobile telephone, a tablet computer, a display device, or an audio playback device.

19. The apparatus of claim 14, wherein the panel comprises glass or aluminum.

20. The apparatus of claim 14, wherein the panel is a part of an outer enclosure of one of the following: a laptop computer, a handheld electronic device, a mobile telephone, a tablet computer, a display device, or an audio playback device.

* * * * *